United States Patent [19]
Downs et al.

[11] Patent Number: 5,614,294
[45] Date of Patent: Mar. 25, 1997

[54] COATING FOR MINIMIZING THERMAL GRADIENTS IN AN ARTICLE

[75] Inventors: James P. Downs; Eduardo Ruano, both of Jupiter, Fla.

[73] Assignee: United Technologies Corporation, Hartford, Conn.

[21] Appl. No.: 346,645

[22] Filed: Nov. 30, 1994

[51] Int. Cl.⁶ ........................................... B32B 7/02
[52] U.S. Cl. ................ 428/212; 428/697; 428/699; 428/701; 428/702; 428/469; 428/472
[58] Field of Search ..................... 428/688, 689, 428/699, 701, 702, 545, 548, 551, 552, 615, 621, 632, 633, 635, 622, 623, 212, 697, 472, 469; 427/248.1, 250, 255, 255.7

[56] References Cited

U.S. PATENT DOCUMENTS

| | | | |
|---|---|---|---|
| 4,211,086 | 7/1980 | Leonard et al. | 62/50 |
| 4,643,951 | 2/1987 | Keem | 428/469 |
| 5,015,502 | 5/1991 | Strangman | 427/248.1 |
| 5,330,851 | 7/1994 | Nakayama | 428/627 |
| 5,350,637 | 9/1994 | Ketcham | 428/539.5 |

*Primary Examiner*—Archene Turner
*Attorney, Agent, or Firm*—Richard D. Getz

[57] ABSTRACT

An article is provided, comprising a structure and a coating for minimizing thermal gradients in the structure. The coating includes a plurality of first layers of thermally conductive material, and a plurality of second layers of thermally conductive material. The first layers of thermally conductive material are less thermally conductive than the second layers at any particular temperature, and the layers are applied to the article such that the second layers of thermally conductive material are distributed amongst the first layers of thermally conductive material. Conduction of thermal energy through the layers to the structure is substantially impeded within the first layers, and substantially laterally dispersed within the second layers, thereby minimizing any thermal gradients within the structure.

18 Claims, 1 Drawing Sheet

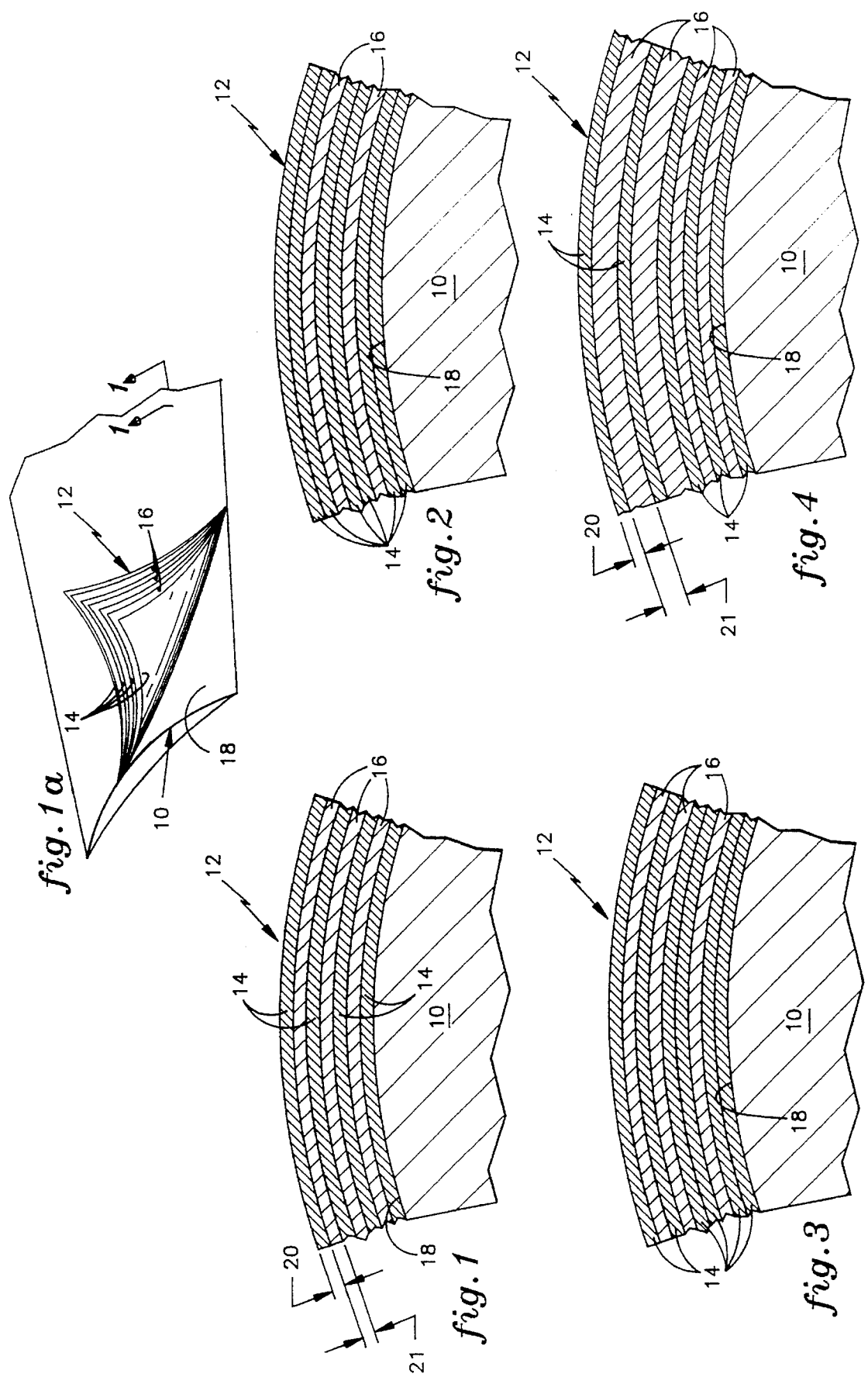

COATING FOR MINIMIZING THERMAL GRADIENTS IN AN ARTICLE

BACKGROUND OF THE INVENTION

1. Technical Field

The present invention pertains to thermal coatings in general, and to coatings for minimizing thermal gradients along the surface of an article in particular.

2. Background Information

It is often advantageous to minimize an article's exposure to thermal energy. In sufficient quantities, thermal energy can cause thermal expansion of an article and in some cases undesirable thermal stress within the article. Thermal stress, in turn, can manifest as stress cracks, reduced ductility, or distortion of the article. This is especially true in instances where the thermal energy is concentrated in a particular region of the article, resulting in a steep thermal gradient within the article.

Insulative coatings may be bonded to the exterior surface of an article to minimize the article's absorption of thermal energy. Typically, the coating has a thermal conductivity value lower than that of the article (or a higher thermal resistance value) and/or a high degree of thermal reflectivity. In many cases, an insulative coating alone is sufficient to prevent or minimize thermal stress within the article. In instances where the thermal energy is concentrated, however, coatings or other insulative means may not be sufficient to prevent the growth of a thermal gradient capable of creating thermal stress within the article.

DISCLOSURE OF THE INVENTION

It is, therefore, an article of the present invention to provide a method for minimizing thermal gradients in an article.

Another object of the present invention is to provide a coating for minimizing thermal stress within an article.

Still another article of the present invention is to provide a coating for minimizing nonuniform heating of an article.

Still another article of the present invention is to provide a coating for minimizing localized cooling of a heated article.

Still another article of the present invention is to provide a coating for minimizing thermal gradients in a rotating article which does not add significantly to the rotating mass of the article.

According to the present invention, an article is provided, comprising a structure and a coating for minimizing thermal gradients in the structure. The coating includes a plurality of first layers of thermally conductive material, and a plurality of second layers of thermally conductive material. The first layers of thermally conductive material are less thermally conductive than the second layers at any particular temperature, and the layers are applied to the article such that the second layers of thermally conductive material are distributed amongst the first layers of thermally conductive material. Conduction of thermal energy through the layers to the structure is substantially impeded within the first layers, and substantially laterally dispersed within the second layers, thereby minimizing any thermal gradients within the structure.

According to one embodiment of the present invention, the first and second layers of thermally conductive material are alternately distributed.

According to another embodiment of the present invention, the distribution frequency of one of the layers is greater closer to the article's surface or, alternatively, is greater closer to the outermost layer.

According to still another article of the present invention, the thicknesses of the first and second layers are selectively varied to alter the thermal conductivity of the layers.

An advantage of the present invention is that a coating is provided for minimizing thermal gradients in an article. Minimizing thermal gradients in an article can minimize thermal stress and distortion within an article.

A further advantage of the present invention is that nonuniform heating of an article can be minimized.

A still further advantage of the present invention is that undesirable localized cooling of a heated article can be minimized.

A still further advantage of the present invention is that thermal gradients can be minimized along surfaces having complex shapes. Under the prior art, it has not always been possible to minimize thermal gradients along surfaces having inwardly or outwardly directed sharp edges, or inaccessible regions, for example. The present invention provides a coating for minimizing thermal gradients that may be applied to complex surface geometries.

A still further article of the present invention is that a method for minimizing thermal gradients in an article is provided which does not significantly add to the mass of the article. Mass added to a high speed rotating article adds to the mechanical load that must be supported, and therefore the stress within the article.

These and other articles, features and advantages of the present invention will become apparent in light of the detailed description of the best mode embodiment thereof, as illustrated in the accompanying drawings.

BRIEF DESCRIPTION OF THE DRAWINGS

FIG. 1A is a diagrammatic view of an airfoil having a multi-layer coating applied to an exterior surface. An edge of the coating is shown peeled away from the airfoil for illustrative purposes.

FIG. 1 is an enlarged sectional diagrammatic view of a thermal coating shown in FIG. 1A.

FIG.2 shows an embodiment of the thermal coating shown in FIG. 1A.

FIG. 3 shows another embodiment of the thermal coating shown in FIG. 1A.

FIG.4 shows still another embodiment of the thermal coating shown in FIG. 1A.

BEST MODE FOR CARRYING OUT THE INVENTION

FIG. 1 shows an exaggerated view of an airfoil 10 having a very thin thermal coating 12 applied to an exterior surface 18. In FIGS. 1–4, an enlarged sectional view of the airfoil 10 is shown with the thermal coating 12 which consists of a plurality of first 14 and second 16 layers. In the preferred embodiment, each first layer 14 comprises a material having a relatively low thermal conductivity value, such as yttria stabilized zirconia. Each second layer 16 comprises a material having a relatively high thermal conductivity, such as nickel aluminide. In the preferred embodiment, the first layers of thermally conductive material have a thermal conductivity value of not greater than 20 Btu-in/hr-ft$^2$-°F.

and the second layers of thermally conductive material have a thermal conductivity value of not less than 100 Btu-in/hr-ft$^2$-°F.

The first 14 and 16 second layers are applied to the airfoil 10 by a process called Electron Beam Physical Vapor Deposition, or "EBPVD". The EBPVD process consists of placing the article to be coated in a vacuum chamber (not shown) along with "targets" of the material to be deposited. An electron gun excites the molecules of the target and causes a plasma cloud to develop consisting of the target material. The plasma cloud, in turn, deposits a very thin layer of the target material on the article. The thickness of the layer can be adjusted by altering the parameters of the process, such as the temperature, the length of time the target is exposed, etc.

FIG. 1 shows one embodiment where the first 14 and second 16 layers are alternated by changing target material every layer. Specifically, a first layer 14 of zirconia having a particular thickness 20 is bonded to the airfoil 10 initially, followed by a second layer 16 of nickel aluminide having a thickness 21 equal to that of the first layer 14. As many alternating layers 14,16 as is advantageous for the particular application may be added subsequently.

In a second embodiment, the order of the layers 14,16 is not alternated, but rather is customized for the application. For example, in a particular application, it may be advantageous to have the greater thermal conductivity of the second layers 16 every "$n^{th}$" layer, where "n" is an integer. FIG.2 shows a coating 12 where the second layers 16 are distributed every third layer.

In a third embodiment, distribution frequency of one of the layers 14,16 is greater in the area closer to the airfoil surface 18 or, alternatively, in the area closer to the outermost layer. For example, the distribution frequency of second layers 16 may be greater towards the outermost layer and decrease in the direction of the airfoil surface 18. FIG.3 shows an example of this where the first 14 and second 16 layers alternate for the outermost four layers and then the frequency of the second layer 16 decreases to ever/third layer for the remaining layers.

In a fourth embodiment, the thicknesses 20,21 of the first 14 and second 16 layers are selectively varied to alter the thermal conductivity of the layers 14,16. FIG.4 shows an example of a coating 12 where the thickness of the two outermost second layers 16 are twice that of the first layers 14.

In all of these embodiments, the lower thermal conductivity of the first layers 14 resists the passage of thermal energy through the coating 12. The higher thermal conductivity of the second layers 16, in contrast, provides an avenue for the thermal energy of a "hot spot" to transfer laterally to cooler regions within the coating 12 and/or airfoil 10. Lateral transfer may be defined as thermal energy traveling substantially perpendicular to the direction of the thermal energy traveling through the coating toward the article. Alternatively, the second layers 16 can provide an avenue for the thermal energy of hotter regions to transfer laterally to a "cold spot" within the coating 12 and/or airfoil 10.

A "hot spot" or a "cold spot" may be defined as a particular region of an article where there is a difference in thermal energy relative to the surrounding regions. In the case of a "hot spot", the thermal energy may be in excess due to a thermal source which exposes a particular region of the article to a greater thermal load. Alternatively, the excess of thermal energy could be caused by a lack of cooling in that particular region of the article. In the case of a "cold spot", an excessive cooling source could cause the thermal energy in a particular region to be significantly less relative to surrounding regions.

Regardless of whether there is an excess of thermal energy or a lack of thermal energy relative to surrounding regions, the difference in thermal energy will cause a thermal gradient between regions of the article. The present invention minimizes the thermal gradient by first minimizing the thermal path through the coating 12 via the low thermal conductivity of the first layers 14 and second by laterally dispersing the thermal energy through the high thermally conductive second layers 16. Dispersing the energy causes the article and the coating 12 to experience a more spatially uniform thermal energy source, and therefore less of a thermal gradient.

Although this invention has been shown and described with respect to the detailed embodiments thereof, it will be understood by those skilled in the art that various changes in form and detail thereof may be made without departing from the spirit and scope of the claimed invention.

We claim:

1. An article, comprising:
   a structure; and
   a coating for minimizing thermal gradients in said structure, said coating including:
   a plurality of first layers of thermally conductive material;
   a plurality of second layers of thermally conductive material;
   wherein said first layers of thermally conductive material are less thermally conductive than said second layers at any particular temperature;
   wherein said layers are applied to said structure such that said second layers of thermally conductive material are distributed amongst said first layers of thermally conductive material;
   wherein conduction of thermal energy through said layers to said structure is substantially impeded within said first layers, and substantially laterally dispersed within said second layers, thereby minimizing said thermal gradient within said structure.

2. An article according to claim 1, wherein one of said first or second layers of thermally conductive material is distributed amongst the other of said first or second layers a frequency equal to an integer value.

3. An article according to claim 2, wherein said first and second layers of thermally conductive material are alternately distributed.

4. An article according to claim 3, wherein:
   said first layers of thermally conductive material have a thermal conductivity value of not greater than 20 Btu-in/hr-ft$_2$-°F.; and
   said second layers of thermally conductive material have a thermal conductivity value of not less than 100 Btu-in/hr-ft$_2$-°F.

5. An article according to claim 4, wherein said first layers of thermally conductive material comprise yttria stabilized zirconia.

6. An article according to claim 5, wherein said second layers of thermally conductive material comprise nickel aluminide.

7. An article according to clam 1, wherein the distribution of one of said layers is more frequent closer to the object surface than it is otherwise within the coating.

8. An article according to claim 1, wherein said distribution of one of said layers is more frequent closer to the outermost layer than it is otherwise within the coating.

9. An article according to claim 8, wherein:

said first layers of thermally conductive material have a thermal conductivity value of not greater than 20 Btu-in/hr-ft$_2$-°F.; and said second layers of thermally conductive material have a thermal conductivity value of not less than 100 Btu-in/hr-ft$_2$-°F.

10. An article according to claim 9, wherein said first layers of thermally conductive material comprise yttria stabilized zirconia.

11. An article according to claim 10, wherein said second layers of thermally conductive material comprise nickel aluminide.

12. An article according to claim 1, wherein said first and second thicknesses are selectively varied to alter said thermal conductivity of said layers.

13. An article according to claim 12, wherein:

said first layers of thermally conductive material have a thermal conductivity value of not greater than 20 Btu-in/hr-ft$_2$-°F.; and said second layers of thermally conductive material have a thermal conductivity value of not less than 100 Btu-in/hr-ft$_2$°F.

14. An article according to claim 13, wherein said first layers of thermally conductive material comprise yttfia stabilized zirconia.

15. An article according to claim 14, wherein said second layers of thermally conductive material comprise nickel aluminide.

16. An article according to claim 1, wherein:

said first layers of thermally conductive material have a thermal conductivity value of not greater than 20 Btu-in/hr-ft$_2$-°F.; and said second layers of thermally conductive material have a thennat conductivity value of not less than 100 Btu-in/hr-ft$_2$-°F.

17. An article according to claim 10, wherein said first layers of thermally conductive material comprise yttria stabilized zirconia.

18. An article according to claim 11, wherein said second layers of thermally conductive material comprise nickel aluminide.

* * * * *

UNITED STATES PATENT AND TRADEMARK OFFICE
CERTIFICATE OF CORRECTION

PATENT NO. : 5,614,294
DATED : March 25, 1997
INVENTOR(S) : James P. Downs, Eduardo Ruano It is certified that error appears in the above-indentified patent and that said Letters Patent is hereby corrected as shown below:

In column 2 at line 26, change "article" to --object--.
In column 2 at line 27, change "method" to --coating--.
In column 2 at line 32, change "articles" to --objects--.
In column 3 at line 39, change "ever/third" to --every third--.
In column 5 at line 23, change "Btu-in/hr-ft$_2$°F" to --Btu-in/hr-ft$_2$-°F--.
In column 6 at line 2, change "yttfia" to --yttria--.
In column 6 at line 14, change "thennat" to --thermal--.

Signed and Sealed this

Thirty-first Day of March, 1998

Attest:

BRUCE LEHMAN

Attesting Officer   Commissioner of Patents and Trademarks